(12) United States Patent
Nielsen et al.

(10) Patent No.: US 11,809,224 B2
(45) Date of Patent: Nov. 7, 2023

(54) TOPOLOGIES FOR INTERCONNECTING CAPACITIVE AND INDUCTIVE ELEMENTS IN A CAPACITIVELY-COUPLED RIB

(71) Applicant: Microsoft Technology Licensing, LLC, Redmond, WA (US)

(72) Inventors: Max Earl Nielsen, Pocatello, ID (US); Joshua A. Strong, Ellicott City, MD (US); Jose M. Acevedo, Ellicott City, MD (US); Ian G. Thompson, Laurel, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 296 days.

(21) Appl. No.: 17/217,145

(22) Filed: Mar. 30, 2021

(65) Prior Publication Data

US 2022/0317722 A1   Oct. 6, 2022

(51) Int. Cl.
  *G06F 1/10* (2006.01)
  *H03K 3/38* (2006.01)
  *H10N 60/12* (2023.01)
  *H10N 60/80* (2023.01)

(52) U.S. Cl.
  CPC ............. *G06F 1/10* (2013.01); *H03K 3/38* (2013.01); *H10N 60/12* (2023.02); *H10N 60/805* (2023.02)

(58) Field of Classification Search
  CPC ........ G06F 1/10; H03K 3/38; H03K 5/15013; H10N 60/12; H10N 60/805
  See application file for complete search history.

(56) References Cited

U.S. PATENT DOCUMENTS

| 9,722,589 | B1 | 8/2017 | Talanov et al. |
| 10,133,299 | B1 | 11/2018 | Strong et al. |
| 10,331,163 | B1 * | 6/2019 | Luo .................... H03K 19/1952 |
| 10,431,867 | B1 | 10/2019 | Strong et al. |
| 10,608,044 | B1 | 3/2020 | Herr et al. |

(Continued)

FOREIGN PATENT DOCUMENTS

EP          3443666 A1     2/2019

OTHER PUBLICATIONS

"International Search Report and Written Opinion Issued in PCT Application No. PCT/US2022/017720", dated Jun. 9, 2022, 15 Pages.

*Primary Examiner* — Daniel D Chang
(74) *Attorney, Agent, or Firm* — Ranjeev Singh; Singh Law, PLLC (57) ABSTRACT

Topologies for interconnecting capacitive and inductive elements in a capacitively-coupled rib are described. An example relates to a resonant clock network (RCN) that resonates in response to both a first clock signal having a first phase and a second clock signal having a second phase. The RCN includes at least one rib coupled to at least one spine. The rib includes a first capacitive line configured to receive the first clock signal and provide, via a first capacitor, a first bias current to a first superconducting circuit. The rib further includes a second capacitive line configured to receive the second clock signal and provide, via a second capacitor, a second bias current to a second superconducting circuit. The rib further includes at least one inductive line configured to connect the first capacitive line with the second capacitive line forming a direct connection between the two capacitive lines.

20 Claims, 7 Drawing Sheets

(56) References Cited

U.S. PATENT DOCUMENTS

| | | | |
|---|---|---|---|
| 10,754,371 B1 * | 8/2020 | Strong | H01P 7/082 |
| 11,283,445 B1 * | 3/2022 | Cherif | H03K 19/195 |
| 2022/0286136 A1 * | 9/2022 | Cherif | H03K 19/195 |

* cited by examiner

TOPOLOGIES FOR INTERCONNECTING CAPACITIVE AND INDUCTIVE ELEMENTS IN A CAPACITIVELY-COUPLED RIB

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based circuits. Such circuits may also be used in combination with CMOS technology based components. Resonant dock networks may be used to distribute dock and power signals to superconducting circuits.

SUMMARY

In one example, the present disclosure relates to a resonant dock network (RCN) configured to resonate in response to both a first clock signal having a first phase and a second clock signal having a second phase. The RCN may include at least one spine and at least one rib coupled to the at least one spine. The at least one rib may include a first capacitive line configured to receive the first clock signal and provide, via a first capacitor, a first bias current to a first superconducting circuit. The at least one rib may further include a second capacitive line configured to receive the second clock signal and provide, via a second capacitor, a second bias current to a second superconducting circuit. The at least one rib may further include at least one inductive line configured to connect the first capacitive line with the second capacitive line forming a direct connection between the first capacitive line and the second capacitive line.

In another aspect, the present disclosure relates to a resonant clock network (RCN) configured to resonate in response to both a first alternating current (AC) clock signal having a first phase and a second AC clock signal having a second phase, where the second phase is opposite of the first phase. The RCN may include at least one spine and at least one rib coupled to the at least one spine. The at least one rib may include a first capacitive line configured to receive the first AC clock signal and provide, via a first capacitor, a first bias current to a first superconducting circuit. The at least one rib may further include a second capacitive line configured to receive the second AC clock signal and provide, via a second capacitor, a second bias current to a second superconducting circuit. The at least one rib may further include at least one inductive line configured to directly connect the first capacitive line with the second capacitive line.

In yet another aspect, the present disclosure relates to a superconducting integrated circuit comprising a first superconducting circuit configured to propagate a first set of single flux quantum (SFQ) pulses. The superconducting integrated circuit may further include a second superconducting circuit configured to propagate a second set of SFQ pulses. The superconducting integrated circuit y further include a resonant clock network (RCN) configured to resonate in response to both a first clock signal having a first phase and a second clock signal having a second phase, where the second phase is opposite of the first phase, and the RCN may include at least one spine, and at least one rib coupled to the at least one spine. The at least one rib may include a first capacitive line configured to receive the first clock signal and provide, via a first capacitor, a first bias current to the first superconducting circuit to provide directionality to the first set of SFQ pulses. The at least one rib may further include a second capacitive line configured to receive the second clock signal and provide, via a second capacitor, a second bias current to the second superconducting circuit to provide directionality to the second set of SFQ pulses. The at least one rib may further include at least one inductive line configured to connect the first capacitive line with the second capacitive line forming a direct connection between the first capacitive line and the second capacitive line.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to topologies for interconnecting capacitive and inductive elements in a capacitively-coupled rib. Certain examples relate to connecting both the positive and negative capacitive lines to the inductive transmission lines. Certain examples described in this disclosure relate to topologies for interconnecting capacitive and inductive elements in a capacitively-coupled resonant clock network powered using alternating current (AC). Certain examples described in this disclosure relate to topologies for interconnecting capacitive and inductive elements in a capacitively-coupled resonant clock network for clocking reciprocal quantum logic (RQL) circuits that may be implemented using wave pipelined logic or phase-mode logic. Such RQL circuits may act as low-power superconductor logic circuits.

Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field, Such materials have almost zero resistance at or below their critical temperature. One example superconductor, niobium, has a critical temperature (Tc) of 9.3 Kelvin. At temperatures below Tc, niobium is superconductive; however, at temperatures above Tc, it behaves as a normal metal with electrical resistance. Thus, in the SIS type of Josephson junctions, superconductors may be niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B gate and a logical AND/OR gate. The A-and-not-B gate may have two inputs and one output. An input pulse A may propagate to the output when favorable clock conditions may be present on an output Josephson transmission line (JTL), unless an input pulse B comes first with respect to either input pulse A or the favorable clock conditions on the output JTL. The logical behavior of the gate is based on the reciprocal data encoding mentioned earlier. As an example, a positive pulse changes the internal flux state of the inductive loop, but the trailing negative pulse erases the internal state every clock cycle, which in turn produces combinational logic behavior.

In one example, clock and power to superconducting circuits is provided by a harmonic radio frequency signal that may have a frequency in a range between 100 MHz to 100 GHz. Resonant clock networks (RCNs) may be used to distribute a clock signal that provides both power and clock to the superconducting circuits. A clock network may deliver the clock signal to several taps distributed throughout a superconducting integrated circuit. The clock signal delivered at each tap may need to be substantially equal in amplitude and refer to a common phase with a high degree of precision. Such RCNs may advantageously use lower power by using metamaterial transmission lines (MTLs) as the clock structures. An exemplary MTL may be formed using a chain of identical unit cells, Each unit cell may be a passive microwave circuit having one or two ribs, forming clock-lines, along a spine. As used herein the term "spine" includes, but is not limited to, a conductor for propagating a clock signal (e.g., a sinusoidal signal). As used herein the term "rib" includes, but is not limited to, a conductor that is coupled to the spine and is configured as a standing-wave resonator for propagating the clock signal.

The clock structure (e.g., the MTL) may support zero-order resonance (ZOR) at a finite frequency, whose wavelength may be infinite along the direction of the spine, but finite along the direction of the ribs. The clock structure may be designed to resonate at the RQL, dock frequency, e.g., the dock frequency that the RQL circuits need docking at. The dock signal may be a sinusoidal dock that may provide AC power to the superconducting logic circuits, Two such docks may provide a four-phase dock. In one example, cross-wired transformers may be used to produce a four-phase clock from two clock signals. For example, by coupling the clock lines to the Josephson junctions in the gates of a respective superconducting circuit in a wound or counter-wound fashion, four phases of dock may be derived. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation.

Clock distribution to various RQL circuit components in a chip may be accomplished by coupling current in the clock line, via RF bias transformers, to the RQL circuits. To ensure even amplitude and phase distribution of power across the entire chip, resonance clock networks (RCNs) may be used. An RCN may employ the standing wave resonance property to reduce clock delay. Since all of the alternating currents in an RCN are due to a standing wave, there may not be any phase variation from one part of the chip to another part of the chip.

In addition, the use of capacitive coupling to superconducting circuits, such as RQL circuits, may further improve these circuits for several reasons. As an example, capacitive coupling may increase the performance of the superconducting circuits because of faster Josephson junction switching. Moreover, because capacitors are easier to fabricate than transformers the fabrication complexity may be reduced. Also, the elimination of the bias inductors and the associated DC flux bias may further reduce the area required for supplying AC power to the superconducting circuits. In addition, the use of the example topologies described herein may remove the need for using an elaborate network of baluns to feed a clock resonator system. The removal of the baluns may further reduce the area required for supplying AC power to the superconducting circuits.

Certain examples described in this disclosure relate to topologies for interconnecting capacitive and inductive elements in a capacitively-coupled rib. Certain examples relate to connecting both the positive and negative capacitive lines to the inductive transmission lines. Example topologies may include a simpler implementation of the inductive elements. In addition, example topologies may result in capacitively-coupled ribs that improve the resonant clock networks in several ways, First, the arrays of ribs can be readily connected to spines to make large resonant clock networks, Second, because the inductive coils at the ends of ribs may be eliminated, this frees up the area occupied by such inductive coils, and thus eliminates gaps otherwise present at spines. Moreover, the freed up area may be used by bias capacitors. Both ends of both the positive and negative capacitive lines are connected together with the inductive transmission lines, which results in a low impedance connection between the positive and negative resonators of each rib. This firm connection also acts as a balun, making a balun outside the ribs unnecessary. This built-in balun action may only be effective at frequencies that are very near the resonant frequency of the resonant clock network. If only one of the positive resonator or the negative resonator is driven, the clock amplitudes at the un-driven and the driven ends of the rib may diverge roughly in proportion to the difference between the drive frequency and the natural frequency. Thus, even with built-in balun action, it may be necessary to provide complementary drive signals to an array of ribs.

Figure 1:
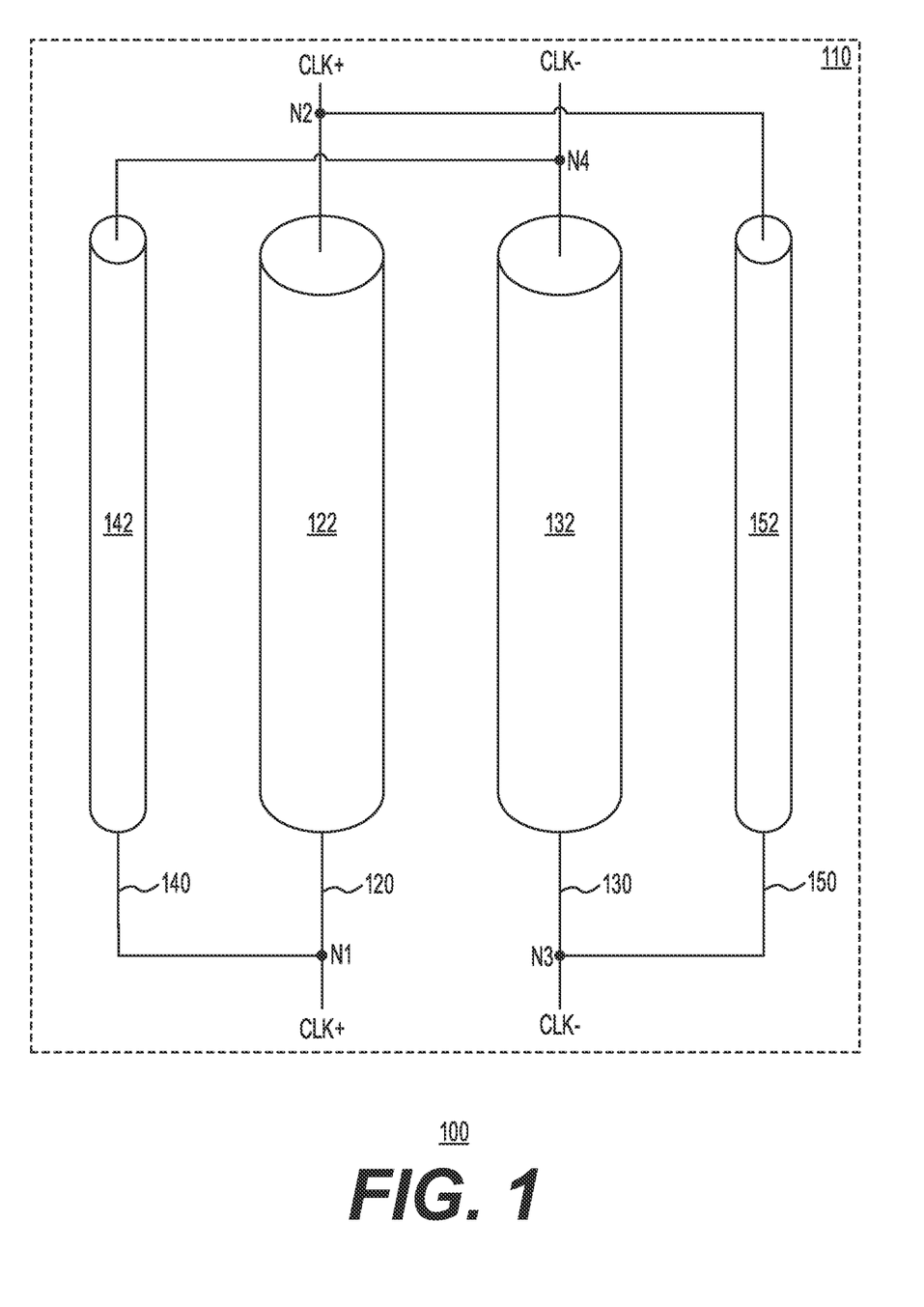
FIG. 1 is a diagram of a superconducting integrated circuit including an example topology for interconnecting capacitive and inductive elements in a capacitively-coupled rib for use with a resonant clock network (RCN)

FIG. 1 is a diagram of a superconducting integrated circuit 100 including an example topology 110 for interconnecting capacitive and inductive elements in a capacitively-coupled rib for use with a resonant clock network (RCN). Topology 110 may include capacitive lines and inductive lines coupled to form a rib of a capacitively-coupled RCN. Capacitive line 120 may be coupled to inductive line 140 at node N1 and coupled to inductive line 150 at node N2. Capacitive line 130 may be coupled to inductive line 150 at node N3 and to inductive line 140 at node N4, forming a figure eight. Capacitive line 120 may be coupled to receive a clock signal via the CLK+ terminal and capacitive line 130 may be coupled to receive another clock signal via the CLK− terminal. The clock signals may be provided by resonator systems (not shown in FIG. 1). Resonator systems may include local oscillators or other types of clock generators for driving the clock signals.

With continued reference to FIG. 1, superconducting circuits (not shown in FIG. 1) may be capacitively-coupled to the capacitive lines (e.g., each of capacitive lines 120 and 130) to receive clock signals. In one example, the clock signal received via the CLK+ terminal may be an AC signal having a phase of 0 degrees and the clock signal received via the CLK− terminal may be an AC signal having a phase of 180 degrees. Each of the capacitive lines and the inductive lines may have a corresponding ground plane. In FIG. 1, the ground plane for the inductive lines and the capacitive lines is shown as cylinders. Thus, cylinder 122 represents the ground plane corresponding to capacitive line 120 and cylinder 132 represents the ground plane corresponding to capacitive line 130. In addition, cylinder 142 represents the ground plane corresponding to inductive line 140 and cylinder 152 represents the ground plane corresponding to inductive line 150.

Still referring to FIG. 1, topology 110 allows the implementation of the inductive lines as straight conductors that are running parallel to the conductive lines. Advantageously, the straightening of the inductors may allow arrays of the ribs to be easily connected to spines to make large resonant clock networks. Moreover, the inductors need not be formed as spiral inductors, flat coils, or helices. The elimination of structures, such as inductive coils, at the ends of ribs may allow additional area for coupling capacitors and thus eliminate the gaps associated with the spines. Taking spiral inductors as an example, a difficult trade-off is faced when designing the spiral inductors for use with capacitively-coupled RONs in superconducting integrated circuits. RONs including spiral inductors, which to save area need to be made of narrow conductors, have several disadvantages. First, narrow conductors can carry less current than the wide ones, thus the number of capacitors in a rib becomes limited by the available width of conductors in the spiral inductors. Second, the spiral inductors have low self-resonant frequencies, which are strongly affected by the variations in width, space, thickness, and material properties. Third, the spiral inductors take up area in an inconvenient location—the spine. The area occupied by the spiral inductors becomes a dead zone where no coupling capacitors can be placed. In sum, topology 110 offers several advantages for capacitively-coupled RCNs.

With continued reference to FIG. 1, the capacitive transmission lines having low impedance may act like lumped capacitors, in which the voltage along them is nearly constant. With near-constant voltage along these lines, the current coupled to logic circuits or, where logic circuits are not present, to ground at various points along the length of the capacitive transmission lines is close to constant, Additionally, in topology 110, the positive and negative capacitive transmission lines are coupled together such that they do not operate separately and independently from each other and can use a shared clock drive source. This prevents the non-uniformity caused when the two capacitive transmission lines are driven using separate sources. Although FIG. 1 shows a certain number of components of superconducting integrated circuit 100 arranged in a certain manner, there could be more or fewer number of components arranged differently. In addition, topology 110 may include an arrangement of the capacitive and inductive elements other than the ones shown in FIG. 1. Moreover, each inductive line may comprise two or more conductors (e.g., three conductors) running alongside the capacitive lines. Having multiple conductors running alongside may increase the inductance associated with the inductive lines, which in turn may improve the uniformity of the voltage along the capacitive lines.

Figure 2:
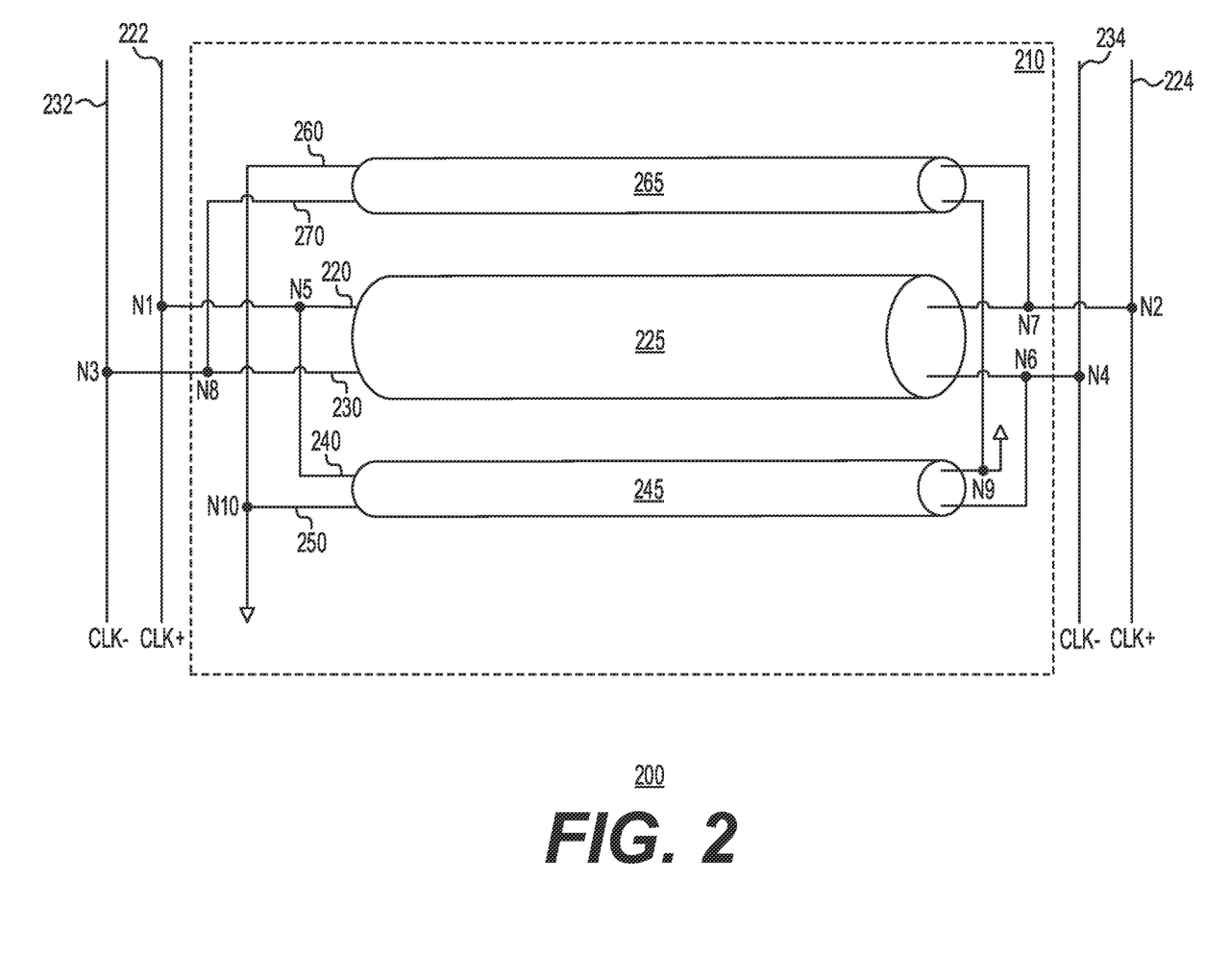
FIG. 2 is a diagram of a superconducting integrated circuit including another example topology for interconnecting capacitive and inductive elements in a capacitively-coupled rib for use with a resonant clock network (RCN)

FIG. 2 is a diagram of a superconducting integrated circuit 200 including another example topology 210 for interconnecting capacitive and inductive elements in a capacitively-coupled rib for use with a resonant clock network (RCN). Topology 210 may include capacitive lines and inductive lines coupled to form a rib of a capacitively-coupled RCN. Topology 210 may further include spines coupled to the rib. Capacitive line 220 may be coupled to receive a dock signal via the CLK+ terminal. In this example, capacitive line 220 may be coupled to spine 222 at node N1 and may further be coupled to spine 224 at node N2. Capacitive line 230 may be coupled to receive a clock signal via the CLK− terminal. In this example, capacitive line 230 may be coupled to spine 232 at node N3 and may further be coupled to spine 234 at node N4. The clock signals may be provided by resonator systems (not shown in FIG. 2) coupled to the spines shown in FIG. 2, Resonator systems may include local oscillators or other types of clock generators for driving the clock signals.

Wth continued reference to FIG. 2, inductive line 240 may be coupled to capacitive line 220 via node N5 and the other end of inductive line 240 may be coupled to the ground terminal, Inductive line 250 may be coupled to capacitive line 230 via node N6 and the other end of inductive line 250 may be coupled to the ground terminal. Inductive line 260 may be coupled to capacitive line 220 via node N7 and the other end of inductive line 260 may be coupled to the ground terminal. Inductive line 270 may be coupled to capacitive line 230 via node N8 and the other end of inductive line 270 may be grounded. In addition, inductive line 230 may be coupled to inductive line 270 via node N8 and inductive line 250 may be coupled to inductive line 260 via node N10. In sum, in this example topology 210, each of the pairs of inductive lines (inductive lines 230, 250 and inductive lines 260, 270) may be coupled to the pair of capacitive lines 220 and 230. As a result, a rib constructed based on topology 210 will automatically enforce a differential mode on the capacitive lines even if only one clock signal source is used to drive the clock signals.

Still referring to FIG. 2, superconducting circuits (not shown in FIG. 2) may be capacitively-coupled to the capacitive lines (e.g., each of capacitive lines 220 and 230) to receive dock signals. In one example, the dock signal received via the CLK+ terminal may be an AC signal having a phase of 0 degrees and the dock signal received via the CLK− terminal may be an AC signal having a phase of 180 degrees. Each of the capacitive lines and the inductive lines may have a corresponding ground plane. In FIG. 2, ground planes for the inductive lines and the capacitive lines are shown as cylinders. Thus, cylinder 225 represents the ground plane corresponding to capacitive lines 220 and 230; cylinder 245 represents the ground plane corresponding to inductive lines 240 and 250; and cylinder 265 represents the ground plane corresponding to inductive lines 260 and 270. Capacitive line 220 may couple a positive voltage bias to the superconducting circuits and capacitive line 230 may couple a negative voltage bias to the superconducting circuits. The inductive lines may provide a direct connection between the positive and negative resonators of each rib, Such a connection may provide a similar functionality as offered by a balun and thus remove the need for the inclusion of baluns in a resonant clock network with topology 210 for the ribs. In one example, the term "direct connection" includes, but is not limited to, a connection between the positive and negative resonators of each rib that is formed independent of any connection formed through clock sources associated with the resonators.

With continued reference to FIG. 2, topology 210, similar to topology 110 shown in FIG. 1, allows the implementation of the inductive lines as straight conductors that are running parallel to the conductive lines. Advantageously, the straightening of the inductors may allow arrays of the ribs to be easily connected to spines to make large resonant clock networks. Moreover, the inductors need not be formed as spiral inductors, flat coils, or helices. The elimination of structures, such as inductive coils, at the ends of ribs may allow additional area for coupling capacitors and thus eliminate the gaps associated with the spines. Taking spiral inductors as an example, a difficult trade-off is faced when designing the spiral inductors for use with capacitively-coupled RCNs in superconducting integrated circuits. As explained earlier, RCNs including spiral inductors, which to save area need to be made of narrow conductors, have several disadvantages. Similar to topology 110 of FIG. 1, topology 210 offers several advantages for capacitively-coupled RCNs.

Still referring to FIG. 2, the capacitive transmission lines having low impedance may act like lumped capacitors, in which the voltage along them is nearly constant. With near-constant voltage along these lines, the current coupled to logic circuits or, where logic circuits are not present, to ground at various points along the length of the capacitive transmission lines is close to constant. Additionally, in topology 210, the positive and negative capacitive transmission lines are coupled together such that they do not operate separately and independently from each other and can use a shared clock drive source. This prevents the non-uniformity caused when the two capacitive transmission lines are driven using separate sources. Although FIG. 2 shows a certain number of components of superconducting integrated circuit 200 arranged in a certain manner, there could be more or fewer number of components arranged differently. In addition, topology 210 may include an arrangement of the capacitive and inductive elements other than the ones shown in FIG. 2. Moreover, each inductive line may comprise two or more conductors (e.g., three conductors) running alongside the capacitive lines. Having multiple conductors running alongside may increase the inductance associated with the inductive lines, which in turn may improve the uniformity of the voltage along the capacitive lines.

Figure 3A:
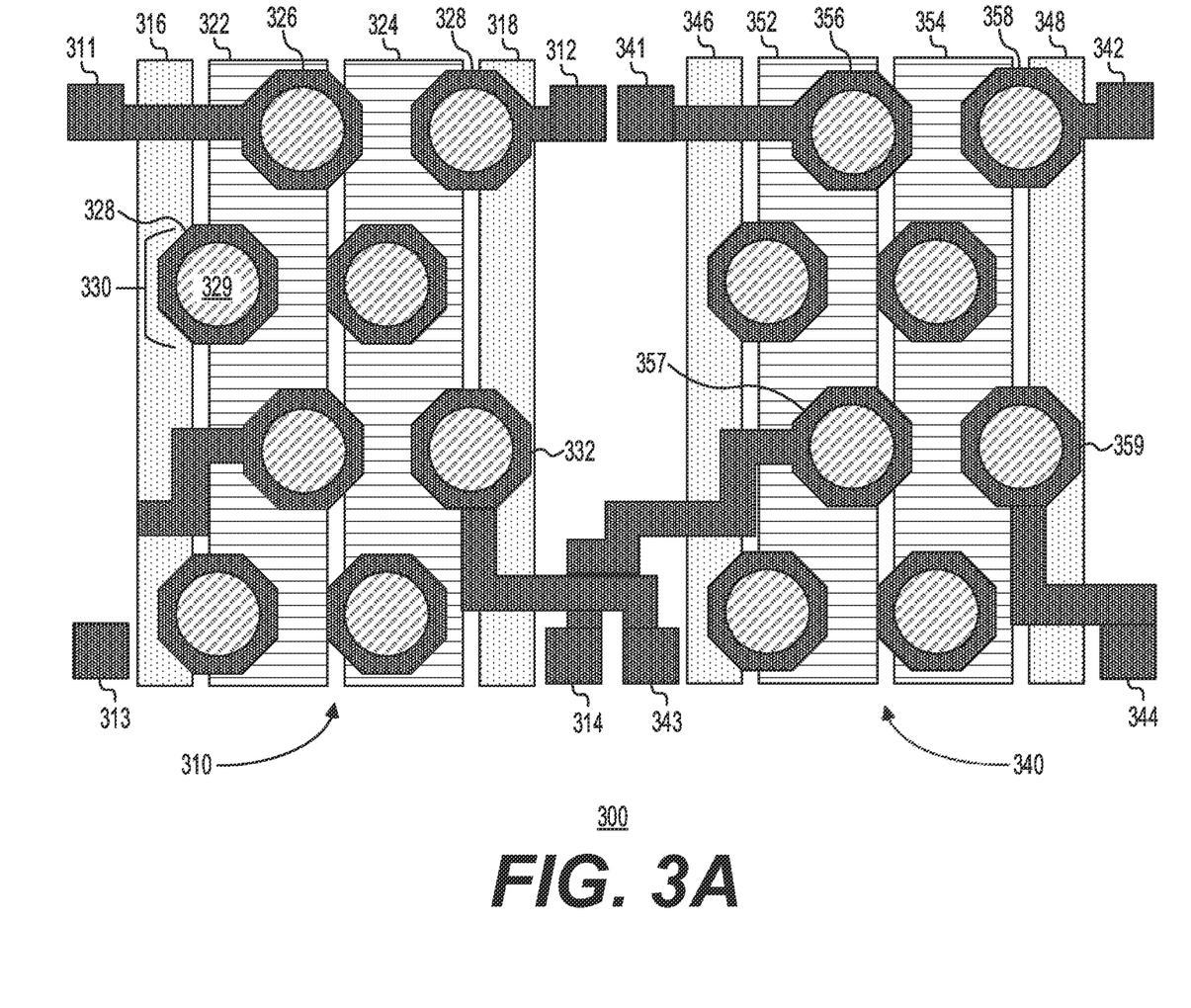
FIG. 3A is a top view of a layout of an example topology for interconnecting capacitive and inductive elements in a capacitively-coupled rib for use with a resonant clock network (RCN)

FIG. 3A is a top view 300 of a layout of an example topology for interconnecting capacitive and inductive elements in a capacitively-coupled rib for use with a resonant clock network (RCN). Top view 300 shows two cells 310 and 340 for an example topology. Cell 310 may be configured to provide AC clock signals having a phase of 0 degrees and 180 degrees. Cell 340 may be configured to provide AC clock signals having a phase of 90 degrees and 270 degrees. Cell 310 may include several taps (e.g., taps 311, 312, 313, and 314) for coupling clock signals to superconducting circuits located on the same integrated circuit as cell 310. Similarly, cell 340 may include several taps (e.g., taps 341, 342, 343, and 344) for coupling clock signals to superconducting circuits located on the same integrated circuit as cell 340. Cell 310 may include inductive lines 316 and 318. Additional inductive lines may also be included as part of a different metal layer associated with the integrated circuit having cell 310. Cell 310 may further include capacitive lines 322 and 324. As shown, in top view 300, the inductive lines 316 and 318 are implemented as straight conductors that run parallel to the capacitive lines. Capacitive line 322 may include several capacitors, including capacitors 326 and 328. Capacitive line 324 may also include several capacitors, including capacitor 332. Each capacitor may include a top plate and a bottom plate. For example, capacitor 328 is shown as having a top plate 329 (the circular shaped plate) and a bottom plate 330 (the plate formed below plate 329). Capacitive lines may be coupled via a capacitor to a tap. As an example, capacitive line 322 is shown as coupled via capacitor 326 to tap 311. As another example, capacitive line 324 is shown as coupled via capacitor 318 to tap 312. Also, capacitive line 324 is shown as coupled via capacitor 332 to tap 343.

With continued reference to FIG. 3A, cell 340 may include inductive lines 346 and 348. Additional inductive lines may also be included as part of a different metal layer associated with the integrated circuit having cell 340. Cell 340 may further include capacitive lines 352 and 354. As shown, in top view 300, the inductive lines 346 and 348 are implemented as straight conductors that run parallel to the capacitive lines. Capacitive line 352 may include several capacitors, including capacitor 357. Capacitive line 354 may also include several capacitors, including capacitors 358 and 359. Each capacitor may include a top plate and a bottom plate. Capacitive lines may be coupled via a capacitor to a tap. As an example, capacitive line 352 is shown as coupled via capacitor 357 to tap 314. As another example, capacitive line 354 is shown as coupled via capacitor 358 to tap 342. Also, capacitive line 354 is shown as coupled via capacitor 359 to tap 344. Although FIG. 3A shows a certain layout of cells 310 and 340, these cells may be laid out differently. In addition, more or fewer taps may be provided.

Figure 3B:
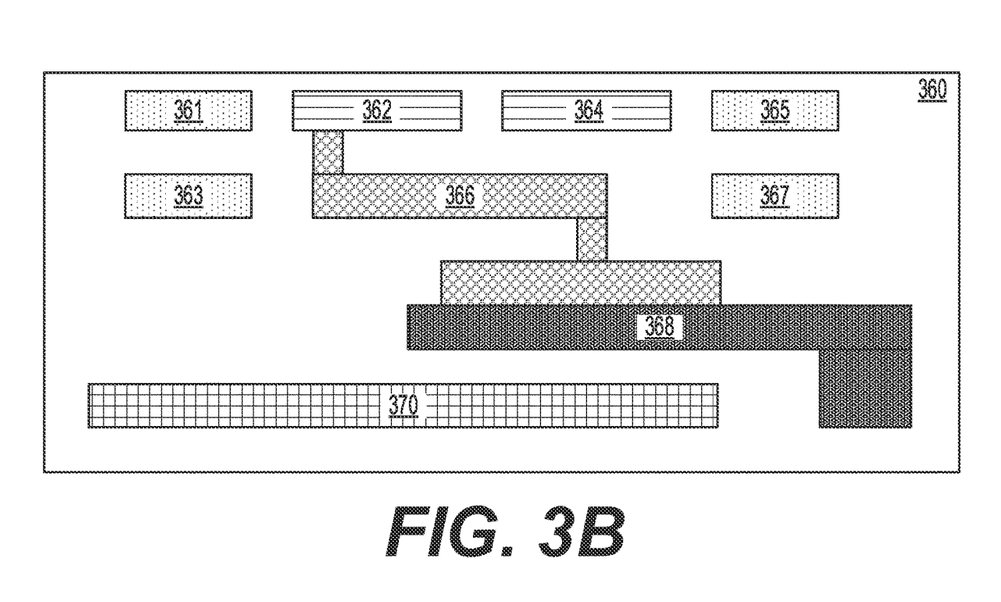
FIG. 3B is a cross-section view of a layout of an example topology for interconnecting capacitive and inductive elements in a capacitively-coupled rib for use with a resonant clock network (RCN)

FIG. 3B is a cross-section view 360 of a layout of an example topology for interconnecting capacitive and inductive elements in a capacitively-coupled rib for use with a resonant clock network (RCN). Cross-section view 360 is a partial view of cell 310. In cross-section view inductive line 361 may correspond to inductive line 316 of FIG. 3A and inductive line 365 may correspond to inductive line 318 of FIG. 3A. Cross-section view 360 further shows an inductive line 363 formed below inductive line 361 and an inductive line 367 formed below inductive line 365. Inductive lines 363 and 365 may be formed in different metal layers of the integrated circuit having cell 310. Cross-section view 360 further shows capacitive line 362, which corresponds to capacitive line 322 of cell 310, and capacitive line 364, which corresponds to capacitive line 324 of cell 310. Cross-section view 360 further shows interconnects 366 for connecting capacitive line 362 to a tap associated with cell 310 via connection 368. In addition, cross-section view 360 further shows a ground plane 370. Although cross-section view 360 shows certain number and arrangement of layers, cell 310 may include additional or fewer layers that may be arranged differently.

Figure 3C:
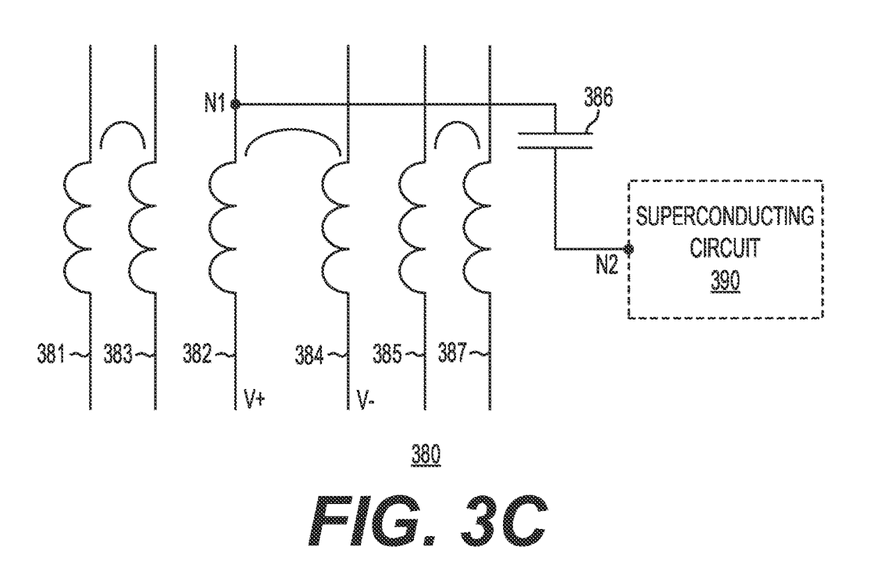
FIG. 3C is a circuit schematic of an example topology for interconnecting capacitive and inductive elements in a capacitively-coupled rib for use with a resonant dock network (RCN)

FIG. 3C is a circuit schematic 380 of an example topology for interconnecting capacitive and inductive elements in a capacitively-coupled rib for use with a resonant dock network (RCN). Circuit schematic 380 is based on an example topology corresponding to the layout of the cell(s) shown in FIGS. 3A and 3B. Circuit schematic 380 further includes a superconducting circuit 390 coupled to one of the taps described above, which allows superconducting circuit 390 to receive clock and/or power signals. Circuit schematic 380 shows inductive lines 381 and 383, which may correspond to inductive lines 361 and 363 of FIG. 38. Circuit schematic 380 further shows inductive lines 385 and 387, which may correspond to inductive lines 365 and 367. Circuit schematic 380 also shows capacitive lines 382 and 384, which may correspond to capacitive lines 362 and 364, Circuit schematic shows a capacitor 386 coupled at node N1 to capacitive line 382. Capacitor 386 is further coupled to superconducting circuit 390 via node N2 to capacitively couple superconducting circuit 390 to the resonant clock network. Superconducting circuit 390 may include at least one Josephson junction, which may receive a bias current from capacitive line 382 via capacitor 386. Although FIG. 3C shows circuit schematic 380 as having a certain number of components that are arranged in a certain manner, there could be more or fewer number of components arranged differently.

Figure 4:
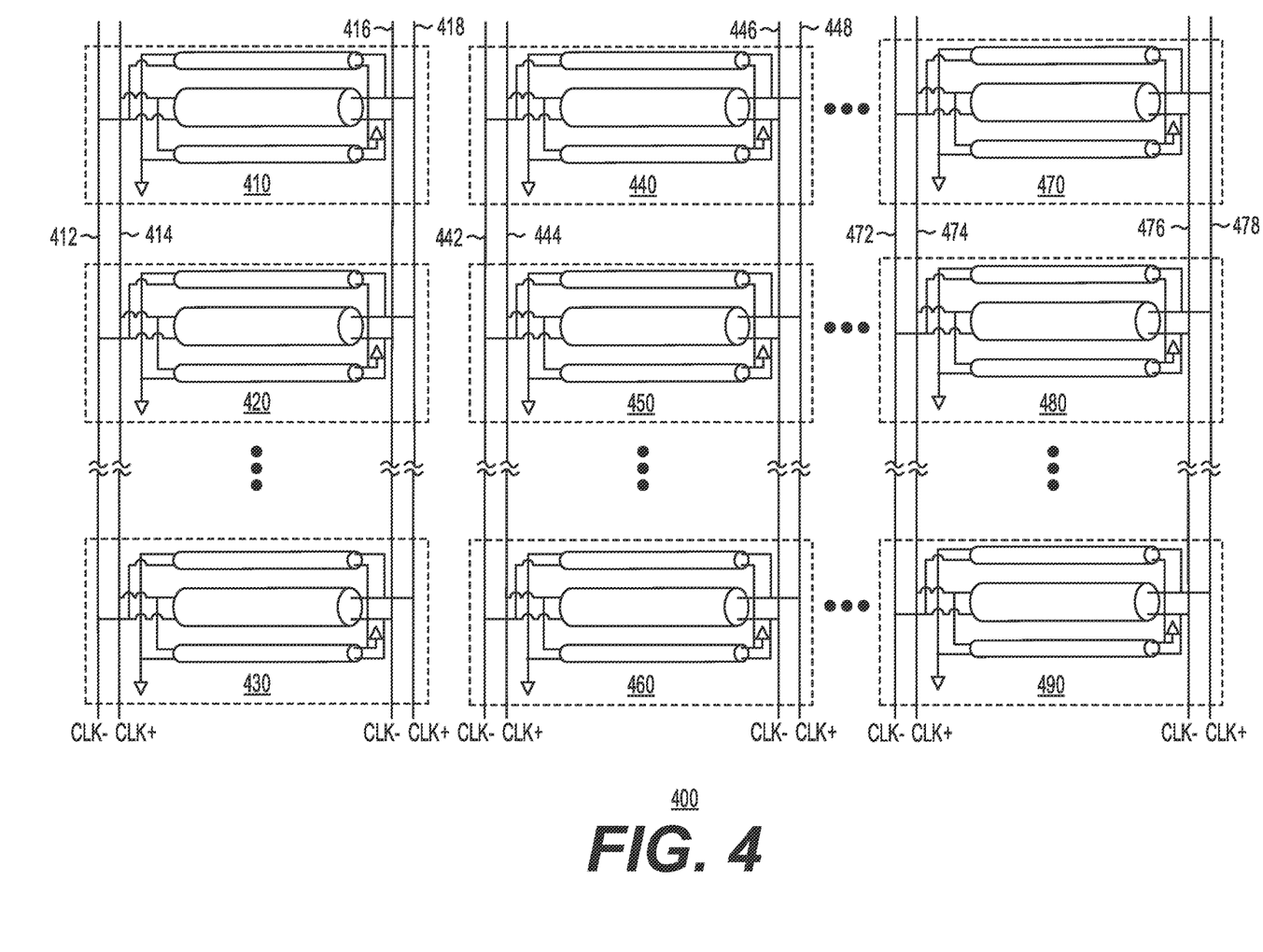
FIG. 4 is a diagram of a resonant clock network including ribs and spines for interconnecting capacitive and inductive elements in a capacitively-coupled resonant clock network (RCN)

FIG. 4 is a diagram of a resonant clock network (RCN) 400 including ribs and spines for interconnecting capacitive and inductive elements in a capacitively-coupled resonant clock network (RCN). Resonant clock network 400 may include an array of ribs. Each rib may have similar topology concerning the interconnections among the capacitive and the inductive elements as described with respect to topology 210 of FIG. 2. In this example, RCN 400 may include ribs 410, 420, 430, 440, 450, 460, 470, 480, and 490, which may be arranged as shown in FIG. 4. Each of these ribs may be coupled to at least one of the spines. Each spine may be coupled to receive a clock signal via one of CLK+ terminal or CLK− terminal. Rib 410 may be coupled to spines 412, 414, 416, and 418. Rib 420 may be coupled to spines 412, 414, 416, and 418. Rib 430 may be coupled to spines 412, 414, 416, and 418. Rib 440 may be coupled to spines 442, 444, 446, and 448. Rib 450 may be coupled to spines 442, 444, 446, and 448. Rib 460 may be coupled to spines 442, 444, 446, and 448. Rib 470 may be coupled to spines 472, 474, 476, and 478. Rib 480 may be coupled to spines 472, 474, 476, and 478. Rib 490 may be coupled to spines 472, 474, 476, and 478. Although FIG. 4 shows a certain number of components of RCN 400 arranged in a certain manner, there could be more or fewer number of components arranged differently.

Wth continued reference to FIG. 4, the use of the topologies described herein as part of RCN 400 may result in an elimination of a hierarchical network of baluns. In addition, the impedance of the capacitively-coupled ribs can be as much as an order of magnitude lower than that of comparable inductively-coupled ribs. This is because the impedance of a capacitively-coupled rib is inversely proportional to the product of the coupling capacitor and frequency. In contrast, the impedance of an inductively-coupled rib is independent of the frequency. Moreover, the power dissipation for capacitively-coupled ribs and the inductively-coupled ribs differs as well. As an example, neglecting frequency dependence of the superconductor losses, power dissipation in the capacitively-coupled ribs is the inverse of the frequency while power dissipation for inductively-coupled ribs is constant with frequency. Thus, the capacitively-coupled ribs may have a lower power dissipation at higher frequencies than the power dissipation for the inductively-coupled ribs.

Figure 5:
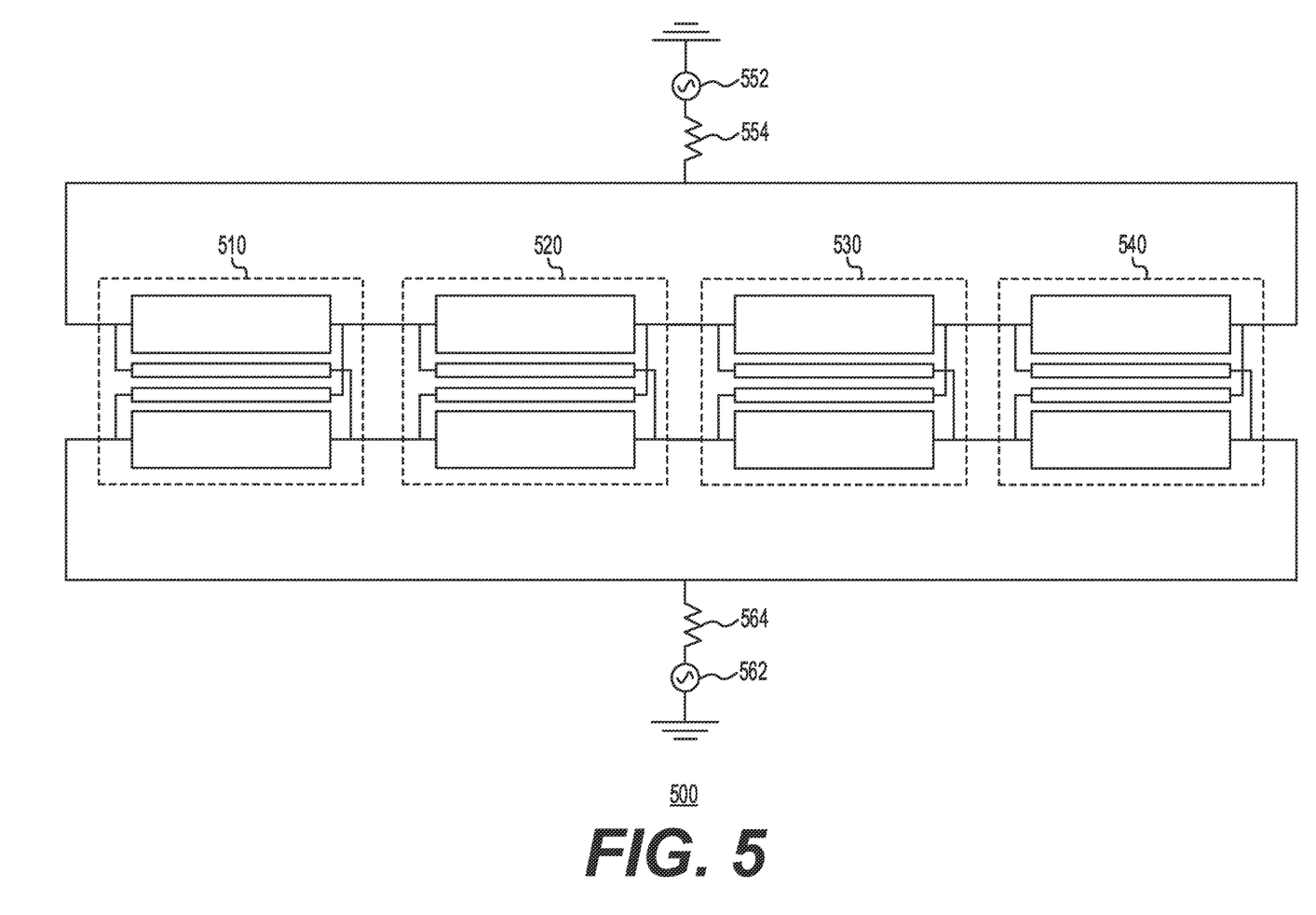
FIG. 5 is a diagram of a superconducting integrated circuit including another example topology for interconnecting capacitive and inductive elements in a capacitively-coupled resonant clock network (RCN)

FIG. 5 is a diagram of a superconducting integrated circuit including another example topology 500 for interconnecting capacitive and inductive elements in a capacitively-coupled resonant clock network (RCN). Topology 500 shows ribs 510, 520, 530, and 540 arranged in a length-wise array. As shown in FIG. 5, clock source 552 may be coupled to the ribs via resistor 554, and clock source 562 may be coupled via resistor 564 to the ribs. Each of clock source 552 and clock source 562 may be an alternating current signal source. In this example, the phase of the AC clock signals provided by clock source 554 may be opposite of the phase of the AC clock signals provided by clock source 564. Although FIG. 5 shows a certain number of components of topology 500 arranged in a certain manner, there could be more or fewer number of components arranged differently.

Figure 6:
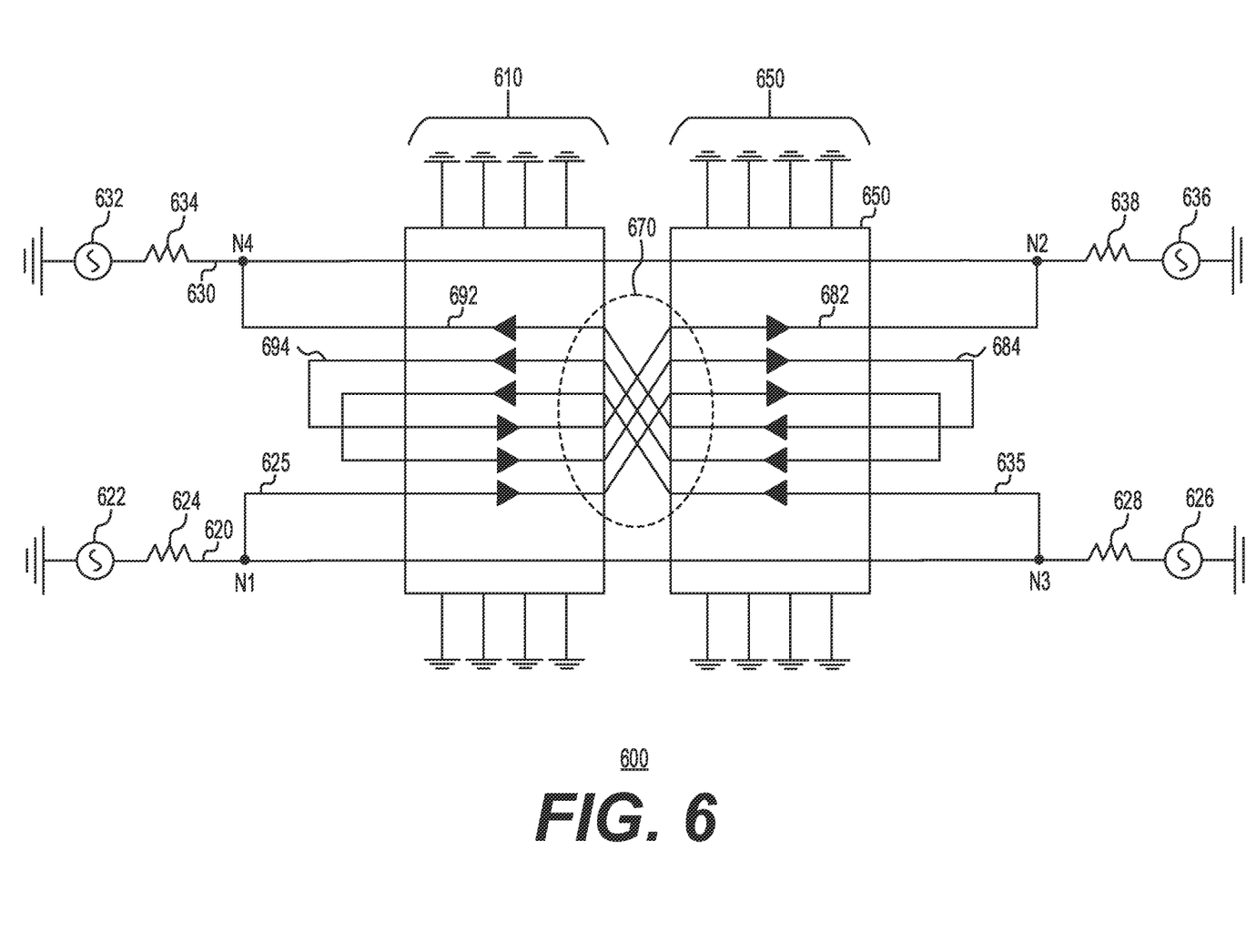
FIG. 6 is a diagram of a superconducting integrated circuit including another example topology for interconnecting capacitive and inductive elements in a capacitively-coupled resonant clock network (RCN).

FIG. 6 is a diagram of a superconducting integrated circuit including another example topology 600 for interconnecting capacitive and inductive elements in a capacitively-coupled resonant clock network (RCN). Topology 600 shows two arrays (array 610 and array 650) of unit cells. Each of the arrays may be coupled to receive clock signals via dock sources 622, 626, 632, and 636 via respective resistors 624, 628, 634, and 638. At any given instant of time, capacitive line 620 may be configured to provide positive voltage and capacitive line 630 may be configured to provide negative voltage. Inductive line 625 may be coupled to capacitive line 620 at node N1. Inductive line 625 may further be coupled to capacitive line 630 at node N2. The arrows along inductive line 625 represent the direction of the current in the conductors corresponding to inductive line 625. Inductive line 635 may be coupled to capacitive line 620 at node N3. Inductive line 635 may further be coupled to capacitive line 630 at node N4, The arrows along inductive line 635 represent the direction of the current in the conductors corresponding to inductive line 635. The dotted area 670 represents the cross-over for the ribs between arrays 610 and 650. This cross-over arrangement provides better uniformity at the expense of some additional layout complexity.

As further shown in FIG. 6, inductive lines 625 and 635 may include conductor segments that run parallel to each other resulting in better inductive coupling. As an example, inductive line 625 may include segments 682 and 684 that run parallel to each other and carry the current in the same direction. Similarly, as another example, inductive line 635 may include segments 692 and 694 that run parallel to each other and carry the current in the same direction. Enhanced coupling among the inductive and capacitive elements shown in FIG. 6 may result in the advantages described previously. Although FIG. 6 shows a certain number of components of topology 600 arranged in a certain manner, there could be more or fewer number of components arranged differently.

Any of the superconducting integrated circuits described herein may be implemented using large scale integrated circuit manufacturing techniques using a process involving niobium metal layers to form the clock lines and the ground plane. To determine the amount of capacitance required for the capacitors for use with an integrated circuit the following equation may be used: $V2\pi fC = I_{JJ}$, where $I_{JJ}$ represents the Josephson junction current, V is the voltage across the capacitor, f is the frequency of the alternating current clock signal, and C is the capacitance of the capacitor. In this example, the impedance (Zc) seen by the clock signal may be represented by the equation: $Zc = 1/\{2\pi fC\}$. Advantageously, capacitive coupling allows the use of high-frequency clock signals because the impedance seen by the clock signal is inversely proportional to the frequency of the clock signal.

Using the example topologies described herein, the superconducting integrated circuits may be configured to operate in a wave pipelined RQL logic mode or in a phase-mode logic (PML) mode. In the wave pipelined RQL logic mode, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock. In the PML based devices, a logical '1' may be encoded as a phase high and a logical '0' may be encoded as a phase low. The transitions between phase high and phase low may be event-triggered by single flux quantum (SFQ) pulses. Unlike wave pipelined RQL mode where the waveform is returned to zero even when a logical value does not change, in the phase-mode logic circuits the waveform is not returned to zero until the logical value of the signal changes. Thus, if a signal has ten logical one values in succession the waveform would go high when the first logical high value is presented and stay high for the remaining logical high values.

In terms of the operation of superconducting integrated circuits connected to a resonant clock network, each clock line may receive the respective AC clock signal and provide a respective bias current to a respective superconducting circuit. The AC clock signal with different phases coupled via different capacitors may propagate digital ones as single flux quantum (SFQ) pulses. The four-phase clock signals may provide directionality such that the positive pulses may ride the leading edge of the clock from one phase to the next and arrive at the output after one cycle of delay. Capacitive coupling may support various data encodings, including interleaved positive and negative pulses, one or multiple positive or negative clock pulses per cycle, or any combination thereof.

In conclusion, in one example, the present disclosure relates to a resonant clock network (RCN) configured to resonate in response to both a first clock signal having a first phase and a second clock signal having a second phase. The RCN may include at least one spine and at least one rib coupled to the at least one spine. The at least one rib may include a first capacitive line configured to receive the first clock signal and provide, via a first capacitor, a first bias current to a first superconducting circuit. The at least one rib may further include a second capacitive line configured to receive the second clock signal and provide, via a second capacitor, a second bias current to a second superconducting circuit. The at least one rib may further include at least one inductive line configured to connect the first capacitive line with the second capacitive line forming a direct connection between the first capacitive line and the second capacitive line.

The second phase may be opposite of the first phase. The at least one inductive line may comprise at least one straight conductor. The RCN may be included in an integrated circuit having multiple metal layers, and where the at least one inductive line comprises a first inductive conductor formed as part of a first metal layer associated with the integrated circuit and a second inductive conductor formed as part of a second metal layer, different from the first metal layer, associated with the integrated circuit. In one example, the RCN may include only straight inductors and may not include spiral inductors or helical inductors.

The first clock signal may comprise a first alternating current (AC) clock signal and the second clock signal may comprise a second alternating current (AC) clock signal. In one example, the first AC clock signal may be configured to supply power to the first superconducting circuit and the second AC clock signal may be configured to supply power to the second superconducting circuit.

In another aspect, the present disclosure relates to a resonant clock network (RCN) configured to resonate in response to both a first alternating current (AC) clock signal having a first phase and a second AC clock signal having a second phase, where the second phase is opposite of the first phase. The RCN may include at least one spine and at least one rib coupled to the at least one spine. The at least one rib may include a first capacitive line configured to receive the first AC clock signal and provide, via a first capacitor, a first bias current to a first superconducting circuit. The at least one rib may further include a second capacitive line configured to receive the second AC clock signal and provide, via a second capacitor, a second bias current to a second superconducting circuit. The at least one rib may further include at least one inductive line configured to directly connect the first capacitive line with the second capacitive line.

In one example, the RCN may include at least two spines. The at least one inductive line may comprise at least one straight conductor. The RCN may be included in an integrated circuit having multiple metal layers, and where the at least one inductive line may comprise a first inductive conductor formed as part of a first metal layer associated with the integrated circuit and a second inductive conductor formed as part of a second metal layer associated with the integrated circuit.

In one example, the RCN may not include spiral inductors or helical inductors. The first AC clock signal may be configured to supply power to the first superconducting circuit and the second AC clock signal may be configured to supply power to the second superconducting circuit.

In yet another aspect, the present disclosure relates to a superconducting integrated circuit comprising a first superconducting circuit configured to propagate a first set of single flux quantum (SFQ) pulses. The superconducting integrated circuit may further include a second superconducting circuit configured to propagate a second set of SFQ pulses. The superconducting integrated circuit may further include a resonant clock network (RCN) configured to resonate in response to both a first clock signal having a first phase and a second clock signal having a second phase, where the second phase is opposite of the first phase, and the RCN may include at least one spine, and at least one rib coupled to the at least one spine. The at least one rib may include a first capacitive line configured to receive the first clock signal and provide, via a first capacitor, a first bias current to the first superconducting circuit to provide directionality to the first set of SFQ pulses. The at least one rib may further include a second capacitive line configured to receive the second clock signal and provide, via a second capacitor, a second bias current to the second superconducting circuit to provide directionality to the second set of SFQ pulses. The at least one rib may further include at least one inductive line configured to connect the first capacitive line with the second capacitive line forming a direct connection between the first capacitive line and the second capacitive line.

In one example, each of the first set of SFQ pulses and the second set of SFQ pulses may include both positive and negative SFQ pulses. The at least one inductive line may comprise at least one straight conductor. The superconducting integrated circuit may include multiple metal layers, and the at least one inductive line may comprise a first inductive conductor formed as part of a first metal layer associated with the integrated circuit and a second inductive conductor formed as part of a second metal layer, different from the first metal layer, associated with the integrated circuit. In one example, the RCN may include only straight inductors and may not include spiral inductors or helical inductors.

In one example, the first clock signal may comprise a first alternating current (AC) clock signal and the second clock signal may comprise a second alternating current (AC) clock signal. The first AC clock signal may be configured to supply power to the first superconducting circuit and the second AC dock signal may be configured to supply power to the second superconducting circuit.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A resonant clock network (RCN) configured to resonate in response to both a first clock signal having a first phase and a second clock signal having a second phase, the RCN comprising:
   at least one spine; and
   at least one rib coupled to the at least one spine, wherein the at least one rib comprises:
      a first capacitive line configured to receive the first clock signal and provide, via a first capacitor, a first positive voltage to a first superconducting circuit,
      a second capacitive line configured to receive the second clock signal and provide, via a second capacitor, a first negative voltage to a second superconducting circuit,
      a first inductive line configured to connect the first capacitive line with the second capacitive line forming a first direct connection between the first capacitive line and the second capacitive line,
      a third capacitive line configured to receive the first clock signal and provide, via a third capacitor, a second positive voltage to a third superconducting circuit,
      a fourth capacitive line configured to receive the second clock signal and provide, via a fourth capacitor, a second negative voltage to a fourth superconducting circuit, and
      a second inductive line configured to connect the third capacitive line with the fourth capacitive line forming a second direct connection between the third capacitive line and the fourth capacitive line.

2. The RCN of claim 1, wherein the second phase is opposite of the first phase.

3. The RCN of claim 1, wherein the first inductive line comprises at least one straight conductor.

4. The RCN of claim 1, wherein the RCN is included in an integrated circuit having multiple metal layers, and wherein the at east one first inductive line comprises a first inductive conductor formed as part of a first metal layer associated with the integrated circuit and a second inductive conductor formed as part of a second metal layer, different from the first metal layer, associated with the integrated circuit.

5. The RCN of claim 1, wherein the RCN includes only straight inductors and does not include spiral inductors or helical inductors.

6. The RCN of claim 5, wherein the first clock signal comprises a first alternating current (AC) clock signal and wherein the second clock signal comprises a second alternating current (AC) clock signal.

7. The RCN of claim 6, wherein the first AC clock signal is configured to supply power to the first superconducting circuit and wherein the second AC clock signal is configured to supply power to the second superconducting circuit.

8. A resonant clock network (RCN) configured to resonate in response to both a first alternating current (AC) clock signal having a first phase and a second AC clock signal having a second phase, wherein the second phase is opposite of the first phase, the RCN comprising:
   at least one spine; and
   at least one rib coupled to the at least one spine, wherein the at least one rib comprises:
      a first capacitive line configured to receive the first AC clock signal and provide, via a first capacitor, a first positive voltage to a first superconducting circuit,
      a second capacitive line configured to receive the second AC clock signal and provide, via a second capacitor, a first negative voltage to a second superconducting circuit, and
      a first inductive line configured to directly connect the first capacitive line with the second capacitive line,
      a third capacitive line configured to receive the first AC signal and provide, via a third capacitor, a second positive voltage to a third superconducting circuit,
      a fourth capacitive line configured to receive the second AC clock signal and provide, via a fourth capacitor, a second negative voltage to a fourth superconducting circuit, and
      a second inductive line configured to directly connect the third capacitive line with the fourth capacitive line.

9. The RCN of claim 8, wherein the RCN comprises at least two spines.

10. The RCN of claim 8, wherein the first inductive line comprises at least one straight conductor.

11. The RCN of claim 8, wherein the RCN is included in an integrated circuit having multiple metal layers, and wherein the first inductive line comprises a first inductive conductor formed as part of a first metal layer associated with the integrated circuit and a second inductive conductor formed as part of a second metal layer associated with the integrated circuit.

12. The RCN of claim 8, wherein the RCN does not include spiral inductors or helical inductors.

13. The RCN of claim 8, wherein the first AC clock signal is configured to supply power to the first superconducting circuit and wherein the second AC clock signal is configured to supply power to the second superconducting circuit.

14. A superconducting integrated circuit comprising:
   a first superconducting circuit configured to propagate a first set of single flux quantum (SFQ) pulses;
   a second superconducting circuit configured to propagate a second set of SFQ pulses; and
   a resonant clock network (RCN) configured to resonate in response to both a first clock signal having a first phase and a second clock signal having a second phase, wherein the second phase is opposite of the first phase, the RCN comprising at least one spine and at least one rib coupled to the at least one spine, wherein the at least one rib comprises:
      a first capacitive line configured to receive the first clock signal and provide, via a first capacitor, a first positive voltage to the first superconducting circuit to provide directionality to the first set of SFQ pulses, a second capacitive line configured to receive the second clock signal and provide, via a second capacitor, a first negative voltage to the second superconducting circuit to provide directionality to the second set of SFQ pulses, a first inductive line configured to connect the first capacitive line with the second capacitive line forming a first direct connection between the first capacitive line and the second capacitive line, a third capacitive line configured to receive the first clock signal and provide, via a third capacitor, a second positive voltage to a third superconducting circuit, a fourth capacitive line configured to receive the second clock signal and provide, via a fourth capacitor, a second negative voltage to a fourth superconducting circuit, and a second inductive line configured to connect the third capacitive line with the fourth capacitive line forming a second direct connection between the third capacitive line and the fourth capacitive line.

15. The superconducting integrated circuit of claim 14, wherein each of the first set of SFQ pulses and the second set of SFQ pulses includes both positive and negative SFQ pulses.

16. The superconducting integrated circuit of claim 14, wherein the first inductive line comprises at least one straight conductor.

17. The superconducting integrated circuit of claim 14, wherein the superconducting integrated circuit includes multiple metal layers, and wherein the first inductive line comprises a first inductive conductor formed as part of a first metal layer associated with the superconducting integrated circuit and a second inductive conductor formed as part of a second metal layer, different from the first metal layer, associated with the superconducting integrated circuit.

18. The superconducting integrated circuit of claim 14, wherein the RCN includes only straight inductors and does not include spiral inductors or helical inductors.

19. The superconducting integrated circuit of claim 18, wherein the first clock signal comprises a first alternating current (AC) clock signal and wherein the second clock signal comprises a second alternating current (AC) clock signal.

20. The superconducting integrated circuit of claim 19, wherein the first AC dock signal is configured to supply power to the first superconducting circuit and wherein the second AC dock signal is configured to supply power to the second superconducting circuit.

* * * * *